United States Patent
Satoh et al.

(10) Patent No.: US 8,704,206 B2
(45) Date of Patent: Apr. 22, 2014

(54) MEMORY DEVICE INCLUDING TRANSISTOR ARRAY WITH SHARED PLATE CHANNEL AND METHOD FOR MAKING THE SAME

(75) Inventors: Kimihiro Satoh, Beaverton, OR (US); Yiming Huai, Pleasanton, CA (US); Jing Zhang, Los Altos, CA (US)

(73) Assignee: Avalanche Technology Inc., Fremont, CA (US)

( * ) Notice: Subject to any disclaimer, the term of this patent is extended or adjusted under 35 U.S.C. 154(b) by 82 days.

(21) Appl. No.: 13/356,633

(22) Filed: Jan. 23, 2012

(65) Prior Publication Data

US 2013/0126823 A1    May 23, 2013

Related U.S. Application Data

(60) Provisional application No. 61/562,309, filed on Nov. 21, 2011.

(51) Int. Cl.
  *H01L 29/06* (2006.01)
  *H01L 47/00* (2006.01)
  *H01L 29/78* (2006.01)
  *H01L 21/336* (2006.01)

(52) U.S. Cl.
  USPC .............................. 257/5; 257/412; 438/301

(58) Field of Classification Search
  USPC .......................................... 275/5; 438/3, 301
  See application file for complete search history.

(56) References Cited

U.S. PATENT DOCUMENTS

| | | | |
|---|---|---|---|
| 5,155,059 A | 10/1992 | Hieda | |
| 6,114,725 A | 9/2000 | Furukawa et al. | |
| 6,337,497 B1 | 1/2002 | Hanafi et al. | |
| 6,538,916 B2 * | 3/2003 | Ohsawa | 365/149 |
| 6,788,573 B2 | 9/2004 | Choi | |
| 7,009,208 B2 | 3/2006 | Aratani et al. | |
| 7,149,108 B2 | 12/2006 | Rinerson et al. | |
| 7,842,998 B2 * | 11/2010 | Kanemura et al. | 257/326 |
| 8,319,275 B2 | 11/2012 | Shim et al. | |
| 2002/0114191 A1 * | 8/2002 | Iwata et al. | 365/185.23 |
| 2002/0130341 A1 * | 9/2002 | Horiguchi et al. | 257/296 |
| 2005/0001257 A1 | 1/2005 | Schloesser et al. | |
| 2006/0261404 A1 | 11/2006 | Forbes | |
| 2007/0102749 A1 * | 5/2007 | Shirota et al. | 257/314 |
| 2008/0002481 A1 * | 1/2008 | Gogl et al. | 365/189.06 |
| 2008/0285344 A1 * | 11/2008 | Ruttkowski et al. | 365/185.05 |
| 2009/0003070 A1 * | 1/2009 | Gomikawa et al. | 365/185.17 |
| 2009/0027955 A1 * | 1/2009 | Koh et al. | 365/163 |
| 2009/0108325 A1 * | 4/2009 | Kang et al. | 257/316 |
| 2009/0127586 A1 | 5/2009 | Gruening-von Schwerin | |

* cited by examiner

*Primary Examiner* — Matthew Landau
*Assistant Examiner* — Igwe U Anya
(74) *Attorney, Agent, or Firm* — G. Marlin Knight

(57) ABSTRACT

The present invention relates to memory devices incorporating therein a novel memory cell architecture which includes an array of selection transistors sharing a common channel and method for making the same. A memory device comprises a semiconductor substrate having a first type conductivity, a plurality of drain regions and a common source region separated by a common plate channel in the substrate, and a selection gate disposed on top of the plate channel with a gate dielectric layer interposed therebetween. The plurality of drain regions and the common source region have a second type conductivity opposite to the first type provided in the substrate.

22 Claims, 9 Drawing Sheets

MEMORY DEVICE INCLUDING TRANSISTOR ARRAY WITH SHARED PLATE CHANNEL AND METHOD FOR MAKING THE SAME

RELATED APPLICATIONS

The present application is a continuation-in-part application of U.S. provisional patent application Ser. No. 61/562,309, filed Nov. 21, 2011, for MEMORY DEVICE INCLUDING TRANSISTOR ARRAY SHARING COMMON CHANNEL AND PROCESS FOR MAKING THE SAME, by SATOH et al., included by reference herein and for which benefit of the priority date is hereby claimed.

FIELD OF THE INVENTION

The present invention relates to Field Effect Transistors (FET), particularly to selection transistors in memory devices.

BACKGROUND OF THE INVENTION

Resistive memory is a new class of non-volatile memory, which can retain the stored information when powered off. A resistive memory device normally comprises an array of memory cells, each of which includes at least a resistive memory element and a selection element coupled in series between appropriate electrodes. Upon application of an appropriate voltage or current to the resistive memory element, the electrical resistance of the resistive memory element would change accordingly, thereby switching the stored logic in the respective memory cell.

A resistive memory element can be classified into at least one of several known groups based on its resistively switching mechanism. The resistive memory element of Phase Change Random Access Memory (PCRAM) may comprise a phase change chalcogenide compound, which can switch between a resistive amorphous phase and a conductive crystalline phase. The resistive memory element of Conductive Bridging Random Access Memory (CBRAM) relies on the statistical bridging of metal rich precipitates therein for its switching mechanism. The resistive memory element of CBRAM normally comprises a nominally insulating metal oxide material, which can switch to a lower electrical resistance state as the metal rich precipitates grow and link to form conductive paths upon application of an appropriate voltage. The resistive memory element of Magnetoresistive Random Access Memory (MRAM) typically comprises at least two layers of different ferromagnetic materials with a non-magnetic spacer layer interposed therebetween. When a switching pulse is applied to the memory element of a MRAM device, one of the ferromagnetic layers will switch its magnetic field polarity, thereby changing the element's electrical resistance.

A selection element in a memory cell functions like a switch to direct current through the selected memory element coupled thereto. One common selection element is diode, which can reverse bias a non-selected memory cell. While a selection diode has a simple structure that can minimize the cell size of the resistive memory cell, a memory architecture employing the selection diode normally has a slower random access time. Another commonly used selection element is transistor, particularly Field Effect Transistor (FET), which allows for faster selection of memory cells and therefore faster random access time.

Field Effect Transistor (FET), particularly Metal-Oxide-Semiconductor Field-Effect Transistors (MOSFET), is the fundamental building block of integrated circuits and is ubiquitous in modern electronic devices. In a MOSFET device, when an appropriate voltage is applied to a gate, charge carriers move between a source region and a drain region through a conductive channel, which is formed by an electric field generated by the gate voltage through a thin layer of dielectric material know as gate dielectric layer interposed between the gate and the channel.

FIG. 1A is a top view of an array of conventional selection transistors formed in a semiconductor substrate for a memory device. FIG. 1B is a top view of the same array of transistors with selection gates 94A-94D, isolation gate 96, and source lines 98A, 98B omitted to clearly illustrate structures thereneath. Referring to FIG. 1B, the array of conventional transistors formed on a semiconductor substrate comprise a plurality of transistors 100, each of the transistors 100 (individually illustrated as transistors 100A-100H) comprises a respective drain 102A, 102B, 102C, 102D, 102E, 102F, 102G, or 102H (collectively represented as drains 102), a respective common source 104A, 104C, 104E, or 104G (collectively represented as sources 104) which is shared with an adjacent transistor, and a respective channel 106A, 106B, 106C, 106D, 106E, 106F, 106G, or 106H (collectively represented as channels 106) juxtaposed therebetween. As mentioned afore, each of the sources 104 is shared by two adjacent transistors, that is the transistors 100A and 100B share the source 104A, the transistors 100C and 100D share the source 104C, and so on. A plurality of isolation channels 108 are juxtaposed between the drains 102 to electrically isolate two adjacent transistors. Rows of transistors 100 are electrically isolated by Shallow Trench Isolation (STI) 110. Referring now to FIG. 1A, a plurality of parallel selection gates 94 are disposed on top of the channels 106 with a thin layer of gate dielectric (not shown) interposed therebetween. Each of the selection gates 94 is shared by multiple transistors along the extension direction thereof, that is the transistors 100A and 100E share the selection gate 94A, the transistors 100B and 100F share the selection gate 94B, and so on. Each of a plurality of parallel source lines 98A and 98B is coupled to a series of common sources 104 along the extension axis thereof. An isolation gates 96 is disposed on top of isolation channels 108 with a thin layer of gate oxide (not shown) interposed therebetween. Memory elements (not shown) are typically coupled to the drains 102 of the selection transistors 100. A memory cell or a bit includes a respective memory element and a selection transistor coupled thereto.

To be cost competitive, a small memory cell size is desired in order to increase device density. One way to achieve this is to simply shrink the feature size, F, which is the minimum resolvable photolithographic dimension in a particular process technology However, several difficulties can arise when scaling the size of the conventional transistors 100 illustrated in FIGS. 1A and 1B, particularly their channel width, W, to a few tens of nanometers. As the channel width is reduced, the current-carrying capacity or current drivability of the channel is correspondingly reduced. This is a significant issue for resistive memory devices, which require higher currents to switch their memory state.

SUMMARY OF THE INVENTION

The present invention overcomes the current drivability issue associated with the conventional selection transistor by using a novel memory cell architecture which includes an array of selection transistors sharing a common channel, thereby significantly increasing the channel width and the current drivability.

Accordingly, an object of the present invention is to provide a novel memory device having an array of selection transistors sharing a common channel.

Another objective of the present invention is to provide a novel memory device having a conjugate pair of transistor subarrays sharing a common source, wherein transistors in each of the subarrays share a common channel.

Still another objective of the present invention is to provide a novel memory device having memory elements coupled to an array of selection transistors sharing a common channel.

Yet another objective of the present invention is to provide a method for making a novel memory device having an array of selection transistors sharing a common channel.

Therefore, according to one aspect of the present invention, a memory device comprises a semiconductor substrate having a first type conductivity, a plurality of drain regions and a common source region separated by a common plate channel in the substrate, and a selection gate disposed on top of the plate channel with a gate dielectric layer interposed therebetween. The plurality of drain regions and the common source region have a second type conductivity opposite to the first type provided in the substrate.

According to another aspect of the present invention, a memory device comprises a semiconductor substrate having a first type conductivity, a common source region in the substrate extending in a direction, a first plurality of drain regions on one side of the common source region in the substrate and separated therefrom by a first common plate channel, a first selection gate disposed on top of the first common plate channel with a first gate dielectric layer interposed therebetween, a second plurality of drain regions on other side of the common source region in the substrate and separated therefrom by a second common plate channel, and a second selection gate disposed on top of the second common plate channel with a second gate dielectric layer interposed therebetween. The first and second plurality of drain regions and the common source region have a second type conductivity opposite to the first type provided in the substrate.

According to still another aspect of the present invention, a memory device comprises a semiconductor substrate having a first type conductivity; a common source region in the substrate extending in a direction; a first plurality of drain regions on one side of the common source region in the substrate and separated therefrom by a first common plate channel; a first selection gate disposed on top of the first common plate channel with a first gate dielectric layer interposed therebetween; a second plurality of drain regions on other side of the common source region in the substrate and separated therefrom by a second common plate channel; a second selection gate disposed on top of the second common plate channel with a second gate dielectric layer interposed therebetween; a plurality of contacts, each of which is disposed on top of one of the first and second plurality of drain regions; a plurality of resistive memory elements, each of which is disposed on top of one of the contacts; and a plurality of parallel bit lines, each of which connects a series of resistive memory elements along a direction perpendicular to the extension direction of the source regions. The first and second plurality of drain regions and the common source region have a second type conductivity opposite to the first type provided in the substrate.

According to yet another aspect of the present invention, a method for fabricating a memory device comprises the steps of providing a semiconductor substrate having a first type conductivity; forming a plurality of parallel selection gates on the substrate with a gate dielectric layer interposed therebetween; forming a plurality of common source regions in the substrate by a first ion implantation process; and forming a plurality of drain regions in the substrate by a second ion implantation process. The plurality of common source regions and the plurality of drain regions have a second type conductivity opposite to the first type. Each of the plurality of common source regions is separated from at least two of the plurality of drain regions by a common plate channel formed in the substrate beneath one of the plurality of parallel selection gates.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures, which are not necessarily drawn to scale.

DETAILED DESCRIPTION OF THE INVENTION

Figure 1A:
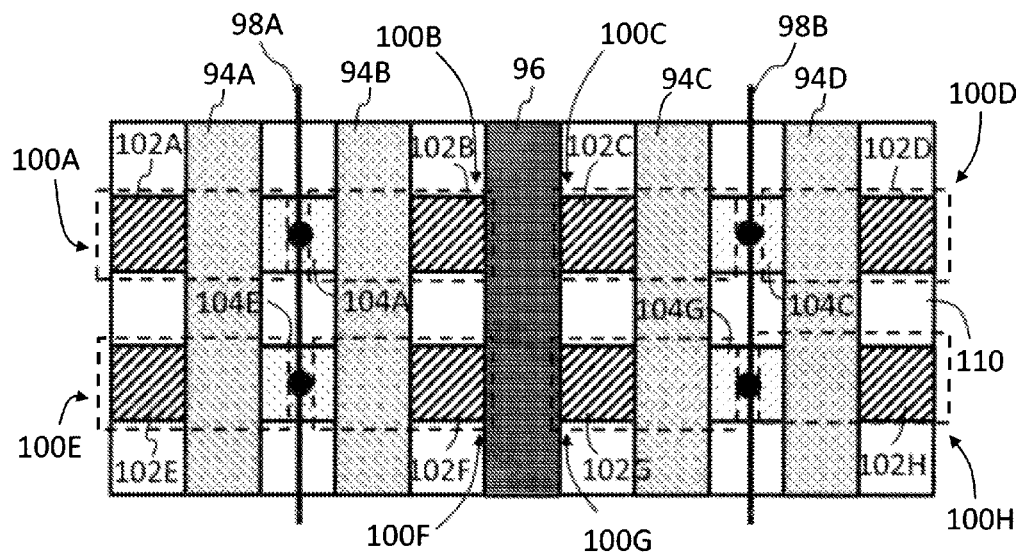
FIGS. 1A and 1B are top views of an array of conventional selection transistors for a memory device with and without gate structures, respectively.
Figure 1B:
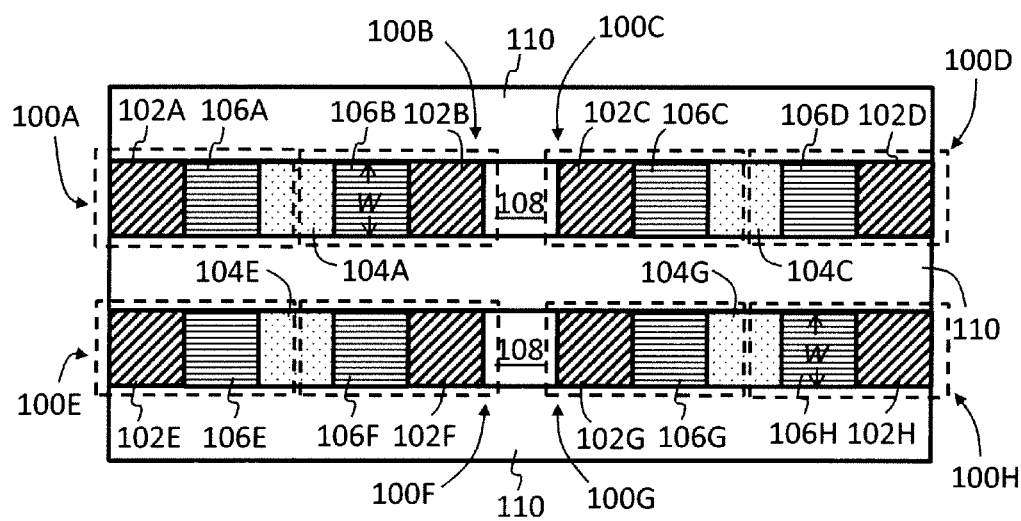

The present invention overcomes the current drivability issue associated with the conventional selection transistor as the feature size shrinks.

An embodiment of the present invention as applied to a memory device having an array of selection transistors sharing a common channel will now be described with reference to FIG. 2. The illustrated device 120 comprises a semiconductor substrate 122 having a first type conductivity, a plurality of drain regions 124 and a common source region 126 with a second type conductivity separated by a common plate channel 128 in the substrate 122, and a selection gate 130 disposed on top of the plate channel 128 with a gate dielectric layer 132 interposed therebetween. The plurality of drain regions and the common source region have a second type conductivity opposite to the first type provided in the substrate. Each of the drain regions 124 is coupled to a memory element (not shown).

Figure 2:
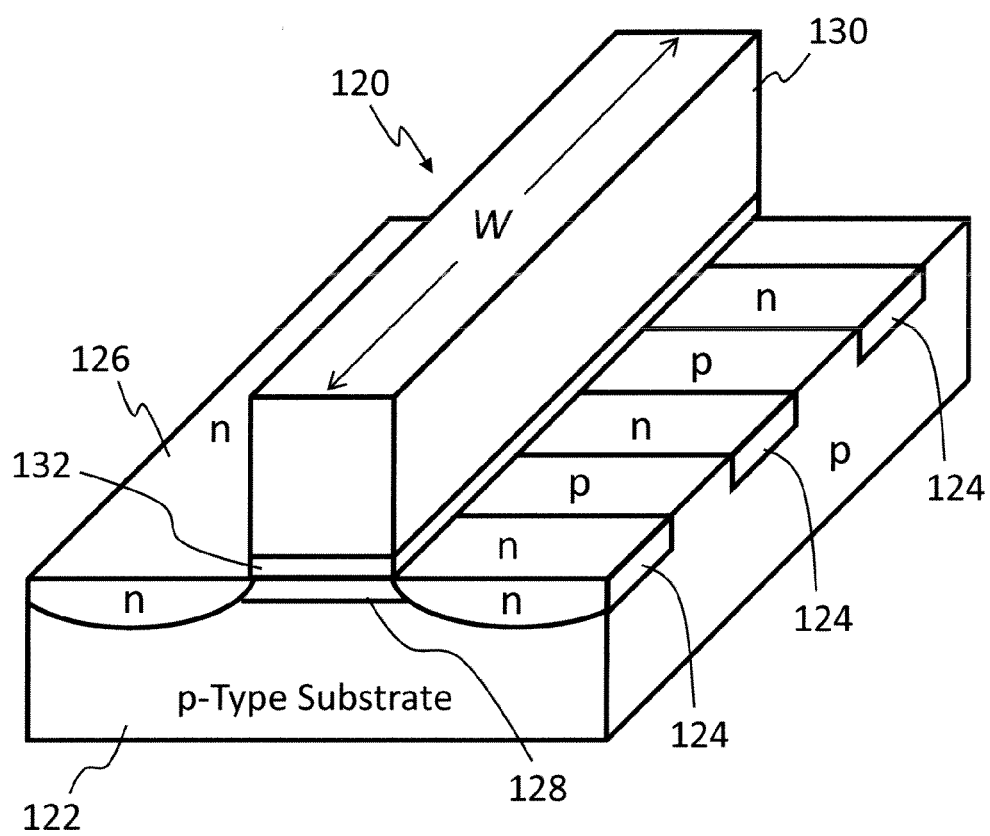
FIG. 2 is a perspective view of an embodiment of the present invention as applied to a resistive memory device having an array of selection transistors sharing a common plate channel and a common source.

With continuing reference to FIG. 2, when an appropriate voltage is applied to the selection gate 130, an electric field is induced across the gate dielectric layer 132 to modulate the conductance of the common plate channel 128, thereby allowing charge carriers to pass therethrough. The source region 126, the selection gate 130, and the plate channel 132 therebeneath have a width of W and are shared by the individual drain regions 124 with memory elements attached thereto. The common source region 126 and the plate channel 128 are continuous and extend along the width direction without any isolation feature, such as STI or LOCal Oxidation of Silicon (LOCOS). As such, the width of the common source region 126 and the common plate channel 128 increases with increasing number of drain regions 124 connected thereto. Although the memory device 120 does not use STI or LOCOS to isolate two adjacent drain regions sharing a same selection gate like a conventional transistor array, the possible current leakage between the two adjacent drain regions is equivalent to the punch through current, which is 5 to 6 orders smaller than the operation current. Moreover, the wider common plate channel 128 permits a lower operation voltage, which further reduces the current leakage.

The substrate 122 may be any semiconductor substrate known in the art, such as silicon (Si), silicon germanium (SiGe), silicon carbide (SiC), SiCGe, II-VI compounds, III-V compounds, or semiconducting epitaxial layers over such substrates. According to an embodiment of the present invention, the substrate 122 is formed of a p-type silicon to provide a base for the formation of the array of selection transistors.

The common source region 126 and individual drain regions 124 with the opposite type conductivity from the substrate 122 may be formed by ion implantation into the substrate 122 with appropriate dopants. In some embodiments where the substrate 122 has the p-type conductivity, the common source region 126 and individual drain regions 124 having the n-type conductivity may be formed by ion implantation using any suitable dopant, such as phosphorous, arsenic, or antimony. When an appropriate voltage is applied to the selection gate 130, charge carriers move between the common source region 126 and one or more of the drain regions 124 by way of the common plate channel 128.

The gate dielectric layer 132 functions like an insulator medium of a capacitor device. When a voltage is applied to the selection gate 130, an electric field is induced across the gate dielectric layer 132 to modulate the conductance of the plate channel 128 therebeneath. The gate dielectric layer 132 preferably has a thickness of between 0.5-5 nm and may comprise any material with sufficiently high dielectric constant, including but not limited to $SiO_x$, $SiO_xN_y$, hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer 132 may be formed by thermal oxidation of the semiconductor substrate 122 or by any suitable thin film deposition method, such as CVD or ALD. In some embodiments where the substrate 122 is formed of silicon, the gate dielectric layer 132 is preferably $SiO_x$ formed by thermal oxidation of the substrate 122. In another embodiment, the gate dielectric layer 132 is formed of a compound comprising hafnium and oxygen, such as $HfO_x$ or $HfSiO_x$.

The selection gate 130 supplies voltage required to modulate the conductance of the plate channel 128 through which charge carriers move from the common source region 126 to one or more of the drain regions 124. The selection gate 130 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. The selection gate 130 may be formed by first depositing one or more layers of conductors using thin film deposition methods such as Physical Vapor Deposition (PVD), Chemical Vapor Deposition (CVD), and Atomic Layer Deposition (ALD), and followed by photo lithography and Reactive Ion Etching (RIE) to define the gate electrode. In an embodiment, the selection gate 130 comprises doped polysilicon. In another embodiment, the selection gate 130 comprises at least one layer formed of $TiN_x$.

Figure 3:
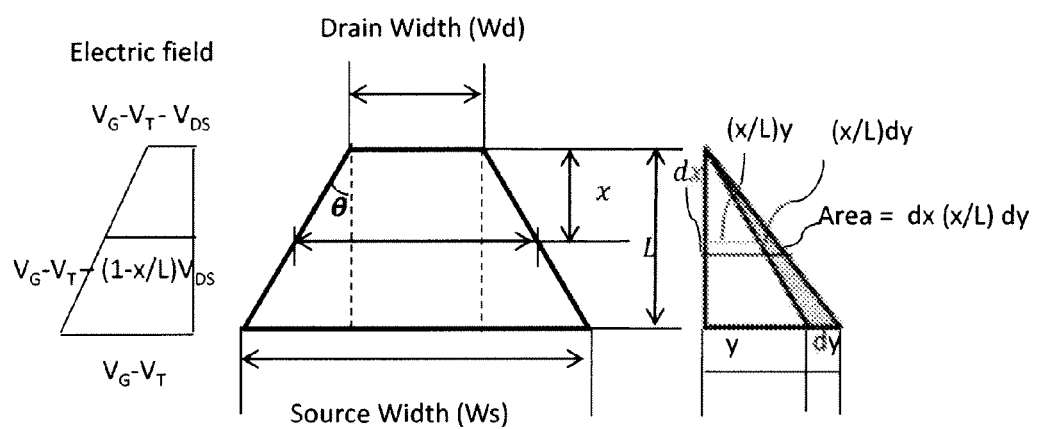
FIG. 3 is a geometric representation of a channel illustrating the effect of source width to drain width on current drivability.

FIG. 3 shows a geometric model illustrating the effect of source width to drain width on current drivability. The source region and drain region have widths of $W_S$ and $W_D$, respectively, and are separated by a channel length of L. As such, the channel in between the source and drain region has a trapezoidal shape when $W_S$ is larger than $W_D$. The trapezoidal channel region comprises a rectangular region and two triangular regions having a top angle of θ. The total drain current $I_{DS}$ is the sum of the current $I_R$ from the rectangular channel and the current $I_T$ from each of the two triangular channels and can be expressed as:

$$I_{DS}=I_R+2I_T, \quad \text{Eq. 1}$$

The rectangular channel current $I_R$ can be expressed as:

$$I_R=C_{ox}\mu_n V_{DS}(W_D/L)(V_G-V_T-1/2V_{DS}) \quad \text{Eq. 2}$$

in the linear region or $$I_R=C_{ox}\mu_n(W_D/L)(V_G-V_T)^2/2 \quad \text{Eq. 3}$$

in the saturation region, where $C_{ox}$ and $\mu_n$ are the capacitance of the gate insulator layer and the mobility of induced electrons, respectively. The current $I_T$ which flows through each of the triangular regions of the channel is derived with a total charge induced under a triangular gate. Considering an incremental area dx dy (x/L) in the triangular channel region which is located at a distance x from the drain in the vertical direction and a distance y from the rectangular channel region in the horizontal direction, the resulting electric field at the incremental area would be $V_G-V_T-V_{DS}(1-x/L)$. Induced charge $d^2Q$ in the incremental area dx dy (x/L) under the gate can be expressed as:

$$d^2Q=C_{ox}dxdy(x/L)(V_G-V_T-V_{DS}(1-x/L)). \quad \text{Eq. 4}$$

Induced charge dQ in the hatched area in FIG. 3 can be calculated by integrating Eq. 4 along the channel length from x=0 to x=L to yield:

$$dQ=\int_0^L dx C_{ox}dy(x/L)(V_G-V_T-V_{DS}(1-x/L))=(LC_{ox}dy)$$
$$((V_G-V_T)/2-V_{DS}/6). \quad \text{Eq. 5}$$

The mobility of induced electrons and the electric field of the hatched area are $\mu_n(L^2+y^2)^{1/2}$ and $V_{ds}/(L^2+y^2)^{1/2}$, respectively. Therefore the current passing through the hatched can be expressed as:

$$dI_T=dQ\mu_n V_{ds}/(L^2+y^2)^{1/2}. \quad \text{Eq. 6}$$

The current which passes through the triangular channel can thus be calculated by integrating Eq. 6 over the entire triangular channel region to yield:

$$I_T=\theta C_{ox}\mu_n V_{ds}((V_G-V_T)/2-V_{DS}/6). \quad \text{Eq. 7}$$

For $V_D>0$ and $V_S=0$, the total drain current through the trapezoidal channel can be calculated by combining Eqs. 1 and 7, and Eq. 2 or 3 to yield:

$$I_{DS}=(W_D/L)C_{ox}\mu_n V_{ds}((V_G-V_T)-V_{DS}/2)+\theta C_{ox}\mu_n V_{ds}$$
$$((V_G-V_T)-V_{DS}/3) \quad \text{Eq. 8}$$

in the linear region or $$I_{DS}=(W_D/L)C_{ox}\mu_n(V_G-V_T)^2/2+2\theta C_{ox}\mu_n V_{ds}((V_G-V_T)^2/3 \qquad \text{Eq. 9}$$

in the saturation region.

For $V_D=0$ and $V_s>0$, the total drain current through the trapezoidal channel is $$I_{DS}=(W_D/L)C_{ox}\mu_n V_{ds}((V_G-V_T)-V_{DS}/2)+\theta C_{ox}\mu_n V_{ds}((V_G-V_T)-2V_{DS}/3) \qquad \text{Eq. 10}$$

in the linear region or $$I_{DS}=(W_D/L)C_{ox}\mu_n(V_G-V_T)^2/2+\theta C_{ox}\mu_n V_{ds}((V_G-V_T)^2/3 \qquad \text{Eq. 11}$$

in the saturation region.

The second terms in Eqs. 8-11 are the additional current carrying capacity attributed to the triangular channel regions resulted from a wider source region. Compared with conventional channel where $W_S=W_D$, the trapezoidal channel in FIG. 3 has 2 to 3 times higher current carrying capacity.

Figure 4A:
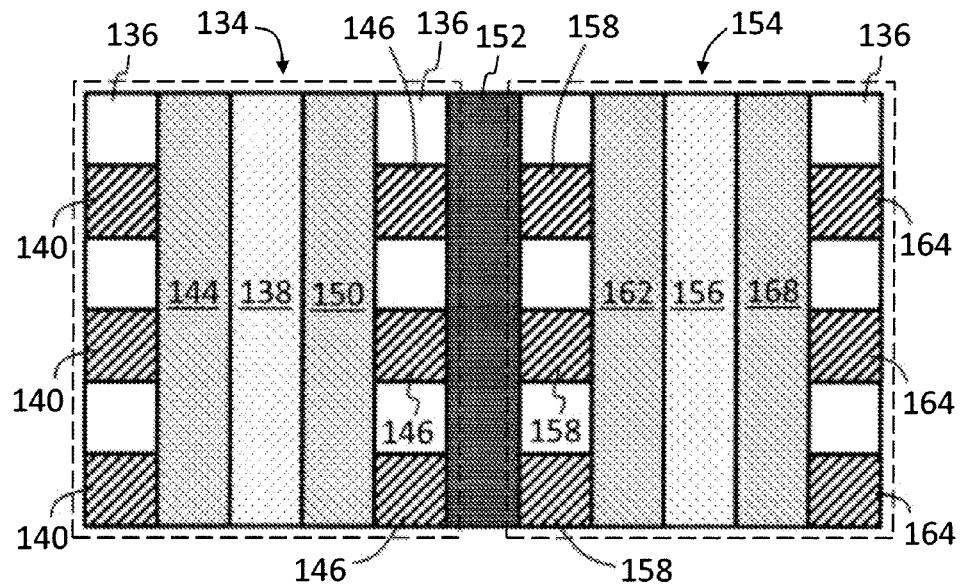
FIGS. 4A and 4B are top views of a resistive memory device having an array of selection transistors sharing a common plate channel with and without gate structures, respectively, in accordance with one or more embodiments of the present invention.
Figure 4B:
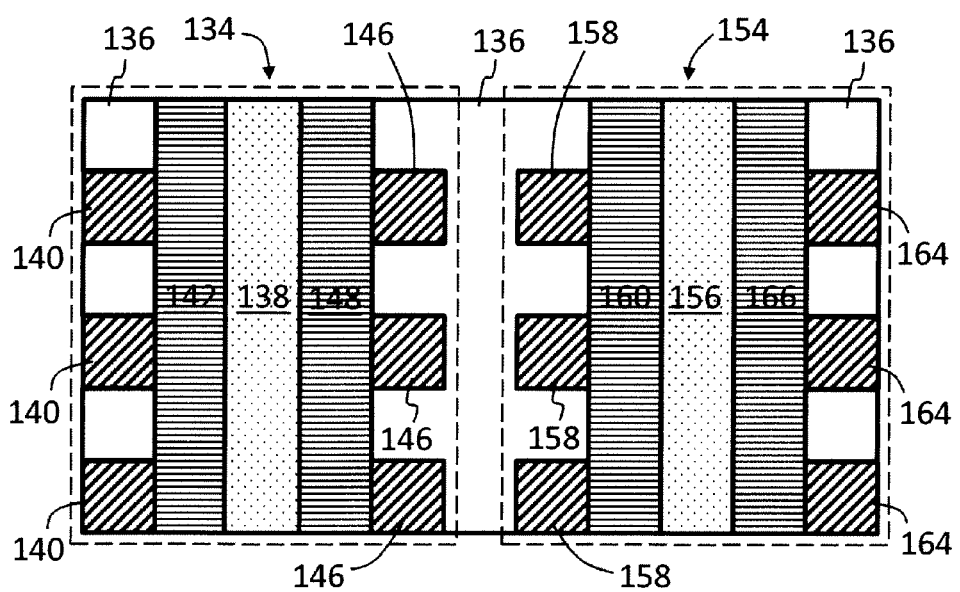

FIG. 4A is a top view of a memory device including an array of selection transistors according to another embodiment of the present invention. The transistor array includes a conjugate pair of transistor subarrays sharing a common source. Transistors in each of the subarrays share a common channel. FIG. 4B is a top view of the same device with respective gates and source lines omitted to clearly illustrate structures therebeneath. The transistor array 134 comprises a semiconductor substrate 136 having a first type conductivity, a common source region 138 in the substrate 136 extending in a direction, a first plurality of drain regions 140 on one side of the common source region 138 in the substrate 136 and separated therefrom by a first common plate channel 142, a first selection gate 144 disposed on top of the first common plate channel 142 with a first gate dielectric layer interposed therebetween, a second plurality of drain regions 146 on other side of the common source region 138 in the substrate 136 and separated therefrom by a second common plate channel 148, and a second selection gate 150 disposed on top of the second common plate channel 148 with a second gate dielectric layer interposed therebetween. The first and second plurality of drain regions 140, 146 and the common source region 138 have a second type conductivity opposite to the first type provided in the substrate 136. The common source region 138 and the plate channels 142, 148 are continuous and extend along a direction without any isolation feature, such as STI or LOCal Oxidation of Silicon (LOCOS). Accordingly, the width of the source region 138 and the common plate channels 142 and 148 increases with increasing number of drain regions 140 and 146 connected thereto.

With continuing reference to FIGS. 4A and 4B, an isolation gate 152 disposed on top of the substrate 136 with the gate dielectric layer interposed therebetweeen electrically isolate the transistor array 134 from an adjacent transistor array 154, which also comprises a respective common source region 156 in the substrate 136, a first plurality of drain regions 158 in the substrate 136 separated from the common source region 156 by a first common plate channel 160, a first selection gate 162 disposed on top of the first common plate channel 160 with a first gate dielectric layer interposed therebetween, a second plurality of drain regions 164 in the substrate 136 separated from the common source region 156 by a second common plate channel 166, and a second selection gate 168 disposed on top of the second common plate channel 166 with a second gate dielectric layer interposed therebetween. It is to be noted that the two transistor arrays 134 and 154 are representative for a plurality of transistor arrays of a memory device wherein the arrays are electrically isolated by a plurality of isolation gates.

The substrate 136 may be any semiconductor substrate known in the art, such as silicon (Si), silicon germanium (SiGe), silicon carbide (SiC), SiCGe, II-VI compounds, III-V compounds, or semiconducting epitaxial layers over such substrates. According to an embodiment of the present invention, the substrate 136 is formed of a p-type silicon to provide a base for the formation of the array of selection transistors.

The common source region 138, 156 and individual drain regions 140, 146, 158, 164 with an opposite type conductivity from the substrate 136 may be formed by ion implantation into the substrate 136 with appropriate dopants. In some embodiments where the substrate 136 has the p-type conductivity, the common source region 138, 156 and individual drain regions 140, 146, 158, 164 having the n-type conductivity may be formed by ion implantation using any suitable dopant, such as phosphorous, arsenic, or antimony.

The gate dielectric layer preferably has a thickness of between 0.5-5 nm and may comprise any material with sufficiently high dielectric constant, including but not limited to $SiO_x$, $SiO_xN_y$, hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer may be formed by thermal oxidation of the semiconductor substrate 136 or by any suitable thin film deposition method, such as CVD or ALD. In some embodiments where the substrate 136 is formed of silicon, the gate dielectric layer is preferably $SiO_x$ formed by thermal oxidation of the substrate 136. In another embodiment, the gate dielectric layer is formed of a compound comprising hafnium and oxygen, such as $HfO_x$ or $HfSiO_x$.

The selection gates 144, 150, 162, 168 supply voltage required to modulate the conductance of the plate channels 142, 148, 160, 166 through which charge carriers move from the common source regions 138, 156 to the drain regions 140, 146, 158, 164. The selection gates 144, 150, 162, and 168 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. The selection gates 144, 150, 162, and 168 may be formed by first depositing one or more layers of conductors using thin film deposition methods such as Physical Vapor Deposition (PVD), Chemical Vapor Deposition (CVD), and Atomic Layer Deposition (ALD), and followed by photo lithography and Reactive Ion Etching (RIE) to define the gate electrode. In an embodiment, the selection gates 144, 150, 162, and 168 comprise doped polysilicon. In another embodiment, the selection gates 144, 150, 162, and 168 comprise at least one layer formed of $TiN_x$.

Figure 5A:
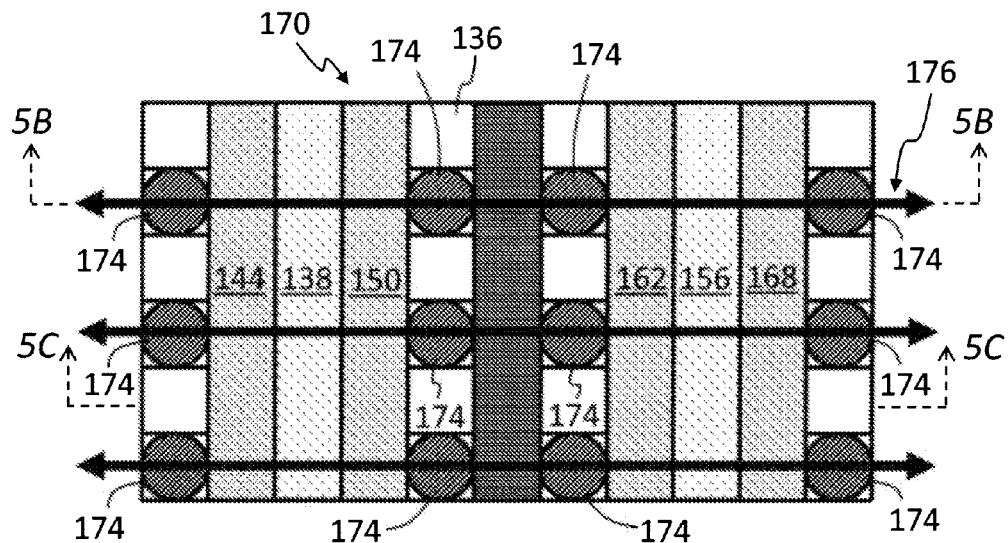
FIG. 5A is a top view and FIGS. 5B and 5C are corresponding cross sectional views of a resistive memory device in accordance with one or more embodiments of the present invention.
Figure 5B:
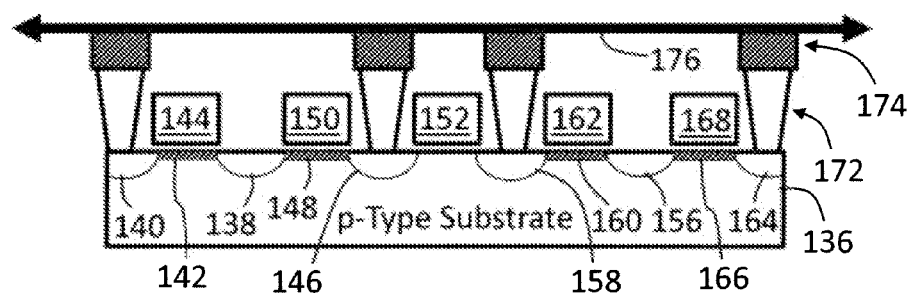
Figure 5C:
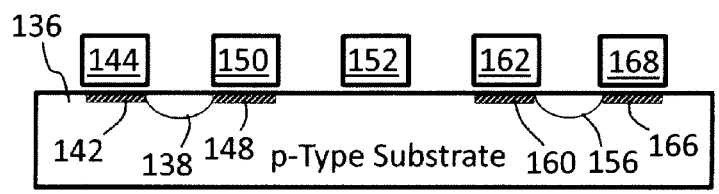

FIGS. 5A-5C show a top view and corresponding sectional views of a memory device in accordance with another embodiment of the present invention. In the drawings, numerals 136 to 168 denote the same components or substances as those shown for the memory device in FIGS. 4A and 4B. The current embodiment is different from the memory device illustrated in FIGS. 4A and 4B in that the current embodiment has added memory elements and bit lines. Referring now to FIGS. 5A-5C, the memory device 170 includes a plurality of contacts 172, each of which is disposed on top of one of the first and second plurality of drain regions 140, 146, 158, and 164; a plurality of resistive memory elements 174, each of which is disposed on top of one of the contacts 172; and a plurality of parallel bit lines 176, each of which connects a series of resistive memory elements along a direction perpendicular to the extension direction of the source regions 138 and 156.

The function of the contacts 172 is to provide Ohmic contact for the drain regions 140, 146, 158, and 164, thereby decreasing the contact resistance. The contacts 172 may be deposited by CVD or PVD and may comprise one or more layers of any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof. In an embodiment, the contacts 172 are made of a material comprising tungsten.

The resistive memory elements 174 may switch their resistance state by any suitable switching mechanism, such as phase change, precipitate bridging, magnetoresistive switching, or combinations thereof. In one embodiment, the resistive memory elements 174 comprise a phase change chalcogenide compound, such as $Ge_2Sb_2Te_5$ or AgInSbTe, which can switch between a resistive amorphous phase and a conductive crystalline phase. In another embodiment, the resistive memory elements 174 comprise a nominally insulating metal oxide material, such as NiO, $TiO_2$, or $Sr(Zr)TiO_3$, which can switch to a lower electrical resistance state as the metal rich precipitates grow and link to form conductive paths upon application of an appropriate voltage. In yet another embodiment, the resistive memory elements 174 comprise at least two layers of ferromagnetic materials with a non-magnetic spacer layer interposed therebetween. When a switching pulse is applied, one of the ferromagnetic layers will switch its magnetic field polarity, thereby changing the element's electrical resistance.

The bit lines (BL) 176 connect rows of memory cells by way of their respective memory elements. The bit lines 176 may comprise any suitable conductive material, such as copper (Cu), tungsten (W), aluminum (Al), silver (Ag), or alloys thereof. The bit lines 176 may be formed by PVD or CVD of the conductive material and then followed by photolithography and dry etch to define the line pattern.

With continuing reference to FIGS. 5A-5C, the selection gates 144, 150, 162, and 168 function as word lines (WL) for controlling selection transistors. The common source regions 138 and 156 function as source lines (SL). In another embodiment, the substrate 136 has the p-type conductivity while the common source regions 138, 156 and drain regions 140, 146, 158, 164 have the n-type conductivity, thereby forming n-type field effect transistors. As such, the insulating gate 152 is grounded or kept at a negative potential to electrically isolate two adjacent drain regions sharing a same bit line. Although the memory device 170 does not use STI or LOCOS to isolate two adjacent drain regions sharing a same word line like a conventional transistor array, the possible current leakage between the two adjacent drain regions is equivalent to the punch through current, which is 5 to 6 orders smaller than the operation current.

Figure 6:
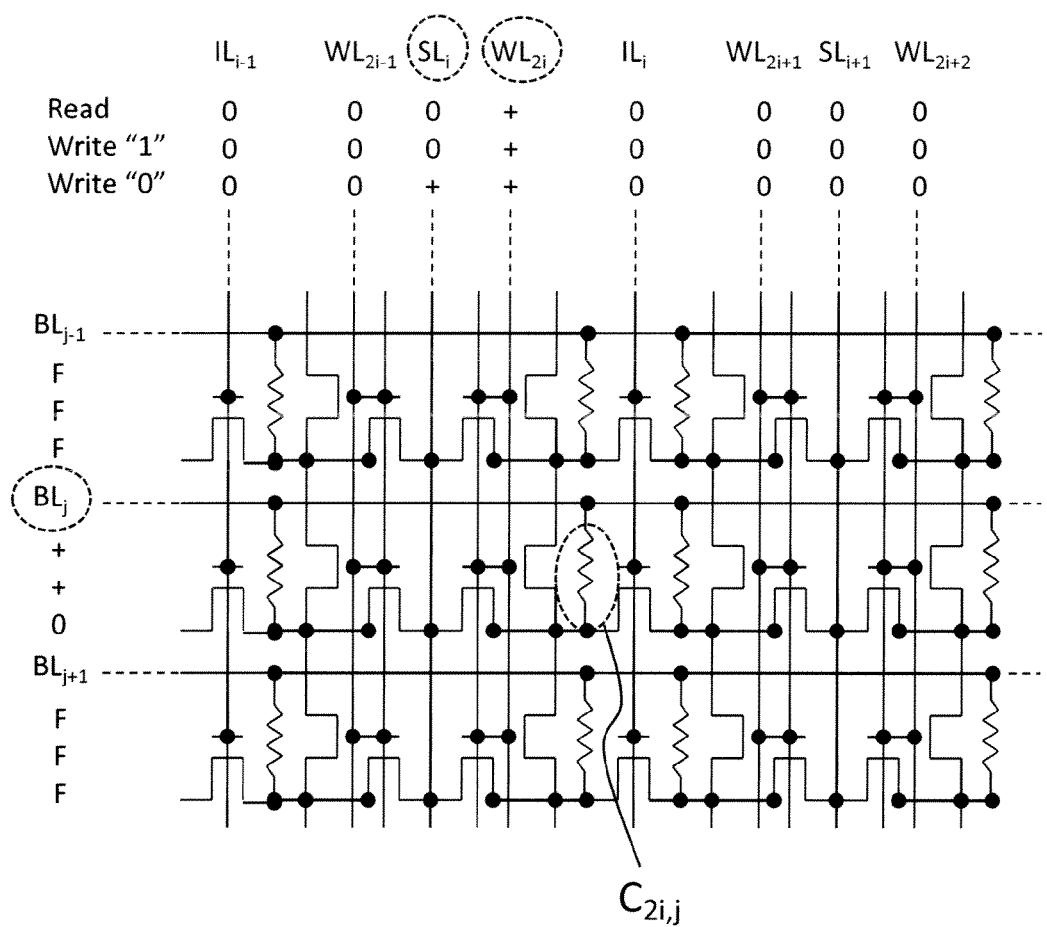
FIG. 6 is a circuit diagram of the memory device illustrated in FIGS. 5A-5C.

Operation of the memory device 170 with n-type selection transistors will now be described with reference to a circuit diagram thereof illustrated in FIG. 6. WL, IL, SL, and BL represent word line, isolation gate, source line, and bit line, respectively. FIG. 6 illustrates an exemplary method of using the resistive memory device 170, which may operate in three different modes: read, write "0," or write "1." A selected memory cell $C_{2i,j}$ comprising a selection transistor and a memory element coupled thereto for read or write operation is situated at the cross point between a selected bit line $BL_j$ and a selected word line $WL_{2i}$. For read or write operations, a suitable positive voltage is applied to the selected word line $WL_{2i}$, thereby forming a common conductive channel shared by selection transistors connected thereto. For the read mode of operation, a positive voltage $V_1$ is applied to the selected bit line $BL_j$, while the selected source line $SL_i$ is grounded. For the write "1" mode of operation, a positive voltage $V_2$, which is higher than $V_1$, is applied to the selected bit line $BL_j$, while the selected source line $SL_i$ is grounded. For the write "0" mode of operation, the selected bit line $BL_j$ is grounded, while a positive voltage is applied to the selected source line $SL_i$. For all modes of operation, source lines and word lines not selected are grounded, while bit lines not selected are floated. All isolation gates are grounded or kept at a negative potential at all time to electrically isolate adjacent memory cells sharing a same bit line (BL).

Figure 7A:
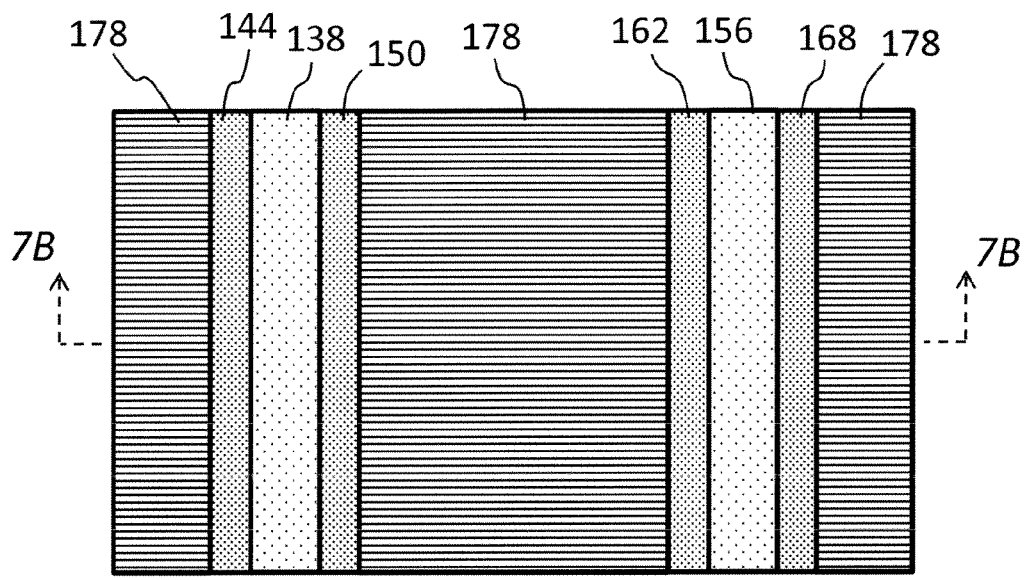
FIGS. 7-9 are top views and corresponding cross sectional views illustrating various stages in formation of a memory device in accordance with one or more embodiments of the present invention.
Figure 7B:
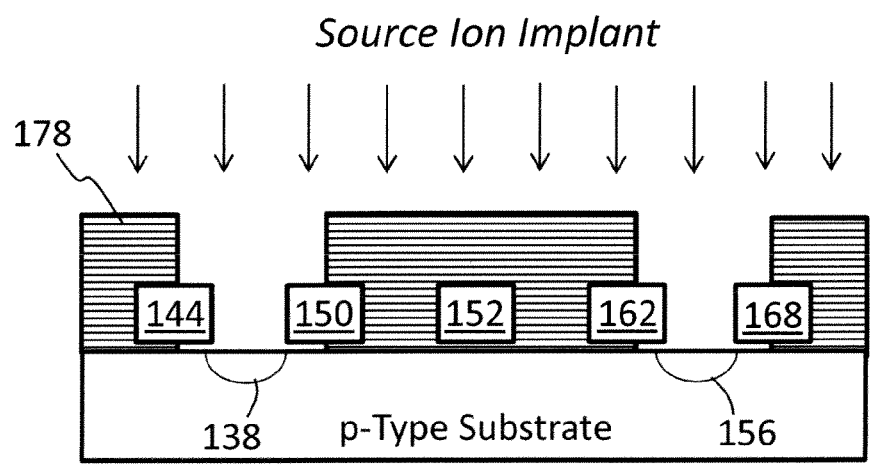

Fabrication of the resistive memory device will now be described with reference to FIGS. 7-9, which illustrate various intermediate structures of the memory device 170 shown in FIGS. 5A-5C. In the drawings, numerals 136 to 168 denote the same components or substances as those shown for the memory device 170 in FIGS. 5A-5C. Referring now to FIGS. 7A and 7B, the processing starts by providing a semiconductor substrate 136 having a first type conductivity. The substrate 136 can be any semiconductor substrate known in the art, such as Si, SiGe, SiC, SiCGe, II-VI compounds, III-V compounds, or semiconducting epitaxial layers over such substrates. In one embodiment, the semiconductor substrate 136 is formed of silicon having a p-type conductivity. A plurality of parallel gates 144, 150, 152, 162, and 168 are formed on the substrate 136 with a gate dielectric layer interposed therebetween. The formation of the gates 144, 150, 152, 162, and 168 includes the steps of depositing a dielectric layer on the substrate, depositing one or more conductive layers on the dielectric layer, and patterning the one or more of conductive layers into the gates 144, 150, 152, 162, and 168 by photolithography and dry etch in a manner as well known to one of skill in the art. The processing continues by forming a source implant mask 178 on top to expose the regions in between pairs of selection gates, that is the region between the selection gates 144 and 150 and the region between the selection gates 162 and 168. The source implant mask 178 may comprise a resist material patterned by photolithography, e-beam lithography, or nanoimprint lithography. Following the formation of the source implant mask 178, the source regions 138 and 156 with a second type conductivity opposite to the first type provided in the substrate 136 are defined by the source ion implantation process, resulting in a structure having a top view and a cross sectional view as illustrated in FIGS. 7A and 7B, respectively. In some embodiments where the substrate 136 has the p-type conductivity and the source regions 138 and 156 have the n-type conductivity, the source ion implantation process may be carried out using any suitable implantation dopant, such as phosphorous, arsenic, or antimony. After the formation of the source regions 138 and 156 by the source ion implantation process, the source implant mask 178 is removed.

Figure 8A:
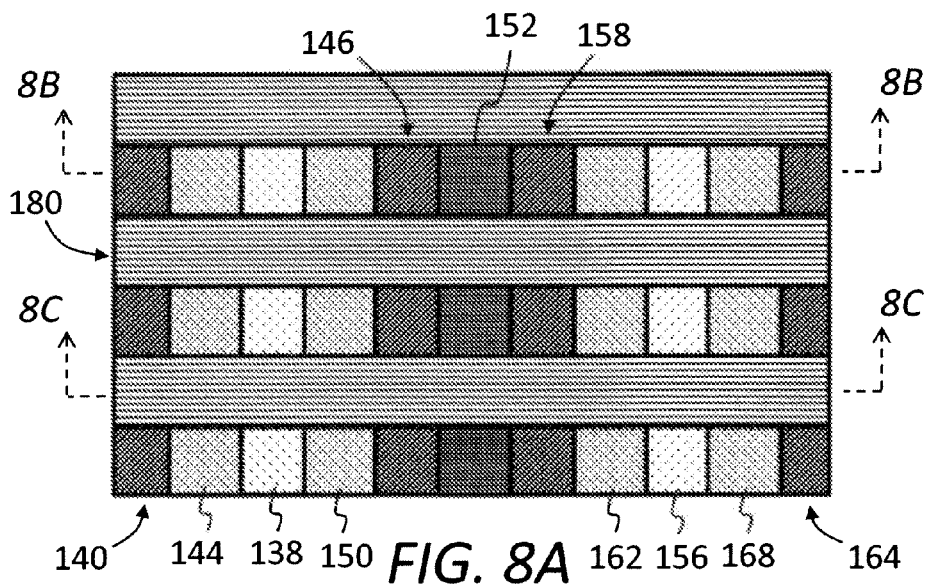
Figure 8B:
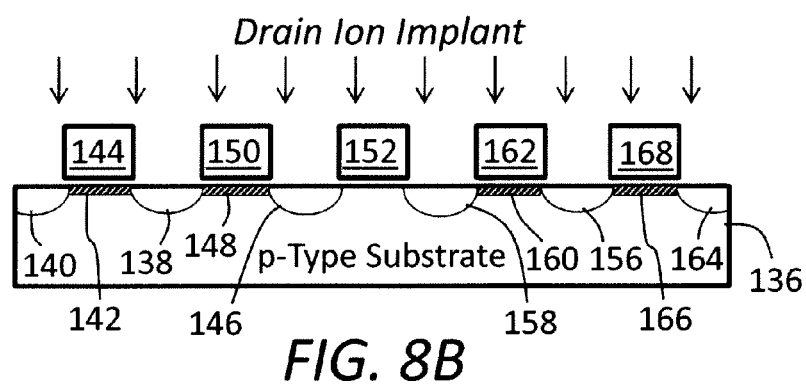
Figure 8C:
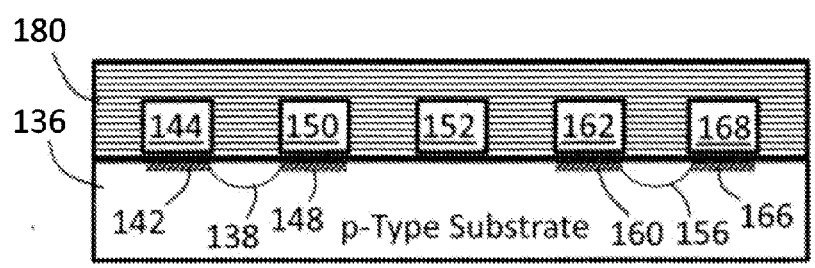

Referring now to FIGS. 8A-8C, a drain implant mask 180 comprising a plurality of parallel line patterns perpendicular to the gates 144, 150, 152, 162, and 168 is formed on top to expose portions of the substrate 136 for the drain region formation process. The drain implant mask 180 may comprise a resist material patterned by photolithography, e-beam lithography, or nanoimprint lithography. The drain regions 140, 146, 158, and 164 with a second type conductivity opposite to the first type provided in the substrate 136 are defined by the drain ion implantation process, resulting in a structure having a top view and corresponding cross sectional views as illustrated in FIGS. 8A-8C. In some embodiments where the substrate 136 has the p-type conductivity and the drain regions 140, 146, 158, and 164 have the opposite n-type conductivity, the drain ion implantation process may be carried out using any suitable implantation dopant, such as phosphorous, arsenic, or antimony. After the formation of the drain regions 140, 146, 158, and 164 by the drain ion implantation process, the drain implant mask 180 is removed.

Figure 9A:
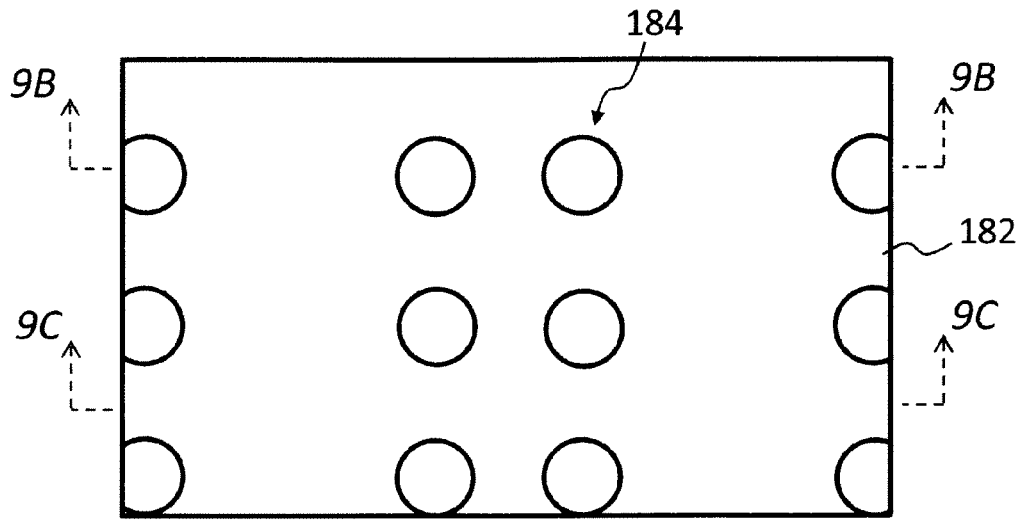
Figure 9B:
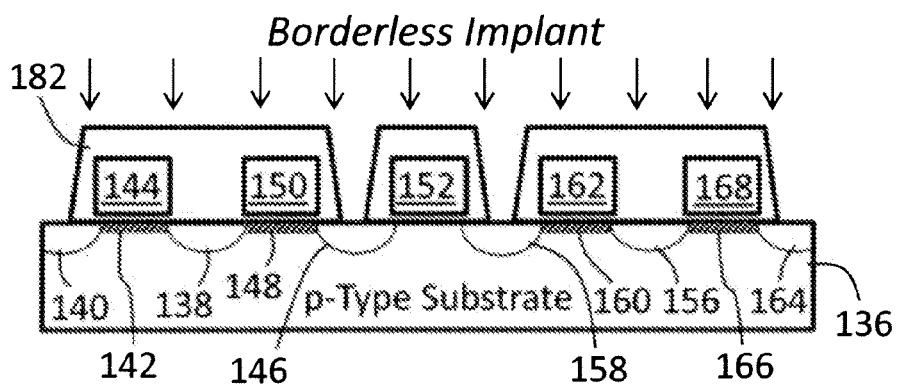
Figure 9C:
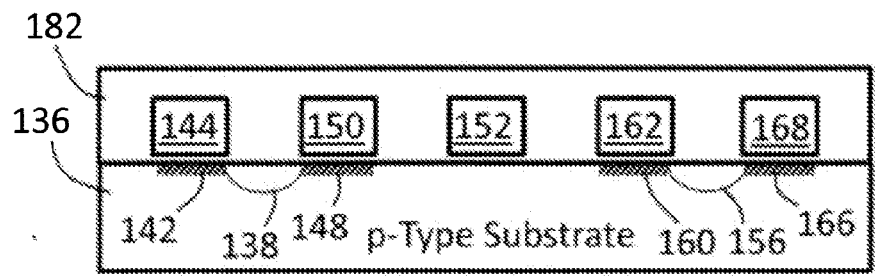

The process continues by forming an interlayer dielectric (ILD) layer 182 that completely covers the gates 144, 150, 152, 162, 168 and fills gaps therebetweeen, and then forming a plurality of contact holes 184 through the ILD layer 182 on top of the drain regions 140, 146, 158, and 164, resulting in a structure having a top view and corresponding cross sectional views as illustrated in FIGS. 9A-9C. The ILD layer 182 may be deposited by PVD, CVD, or ALD and may comprise any suitable dielectric material, such as silicon oxide, Spin-On Glass (SOG), or any insulating material with a sufficiently low dielectric constant. Excess deposited ILD material is then removed by chemical mechanical polishing (CMP) until the ILD surface is substantially flat. The process of contact hole formation includes the steps of patterning a contact hole mask on top of the ILD layer 182 by photo lithography and dry etching to remove the ILD material exposed by the contact hole mask. Following the formation of the contact holes 184, a borderless ion implantation process is applied to prevent possible junction short caused by the misalignment between the contact holes 184 and the drain regions 140, 146, 158, and 164 therebeneath. After the borderless implantation process, the processing continues with the formation of contacts, memory elements, and bit lines according to the conventional processing schemes in a manner as well known to one of skill in the art.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A memory device comprising:
   a semiconductor substrate having a first type conductivity;
   a continuous common plate channel in the substrate that is shared by a plurality of drain regions disposed along a channel width direction;
   the plurality of drain regions disposed along the channel width direction adjacent to a first side of the common plate channel;
   a common source region that extends along the channel width direction and is disposed adjacent to a second side, opposite to the first side, of the common plate channel; and
   a selection gate disposed above said continuous common plate channel with a gate dielectric layer interposed therebetween,
   and wherein said plurality of drain regions and said common source region have a second type conductivity opposite to said first type provided in said substrate.

2. The memory device according to claim 1, wherein said semiconductor substrate comprises silicon.

3. The memory device according to claim 1, wherein said first type and second type conductivities are p type and n type, respectively.

4. The memory device according to claim 1, wherein said gate dielectric layer comprises silicon oxide.

5. The memory device according to claim 1, wherein said gate dielectric layer is formed of a compound comprising hafnium and oxygen.

6. The memory device according to claim 1, wherein said selection gate comprises doped polysilicon.

7. The memory device according to claim 1, wherein said selection gate comprises at least one layer formed of titanium nitride.

8. The memory device according to claim 1 wherein the plurality of drain regions are formed in the semiconductor substrate and each drain region is separated from an adjacent drain region by semiconductor substrate material having the first type conductivity.

9. A memory device comprising:
   a semiconductor substrate having a first type conductivity;
   a common source region in said substrate extending along a first direction;
   a first common plate channel in said substrate having the first type conductivity and extending continuously along the first direction adjacent to a first side of the common source region;
   a first plurality of drain regions in said substrate disposed adjacent to the first common plate channel, wherein the first common plate channel is shared by each of the first plurality of drain regions;
   a first selection gate disposed above the first common plate channel with a first gate dielectric layer interposed therebetween;
   a second common plate channel in said substrate having the first type conductivity and extending continuously along the first direction adjacent to a second side of the common source region opposite to the first side;
   a second plurality of drain regions in said substrate disposed adjacent to the second common plate channel, wherein the second common plate channel is shared by each of the second plurality of drain regions; and
   a second selection gate disposed above the second common plate channel with a second gate dielectric layer interposed therebetween,
   wherein said first and second plurality of drain regions and said common source region have a second type conductivity opposite to the first type provided in the substrate.

10. The memory device according to claim 9, wherein said semiconductor substrate comprises silicon.

11. The memory device according to claim 9, wherein said first type and second type conductivities are p type and n type, respectively.

12. The memory device according to claim 9, wherein said gate dielectric layer comprises silicon oxide.

13. The memory device according to claim 9, wherein said gate dielectric layer is formed of a compound comprising hafnium and oxygen.

14. The memory device according to claim 9, wherein said selection gate comprises doped polysilicon.

15. The memory device according to claim 9 further comprising:
   a plurality of contacts, each of which is disposed on top of one of said first and second plurality of drain regions;
   a plurality of resistive memory elements, each of which is disposed on top of one of said plurality of contacts; and
   a plurality of parallel bit lines, each of which connects a series of resistive memory elements along a direction perpendicular to the first direction.

16. The memory device according to claim 15, wherein said resistive memory elements comprise a precipitate bridging metal oxide consisting of $NiO$, $TiO_2$, $Sr(Zr)TiO_3$, or combinations thereof.

17. The memory device according to claim 15, wherein said resistive memory elements comprise a phase change chalcogenide compound consisting of $Ge_2Sb_2Te_5$ or AgInSbTe.

18. The resistive memory device according to claim 15, wherein said resistive memory elements comprise at least two layers of ferromagnetic materials with a layer of non-magnetic spacer interposed therebetween.

19. The memory device according to claim 15, wherein said contacts are made of a conducting material comprising tungsten.

20. The memory device according to claim 9 wherein the first and second plurality of drain regions are formed in the semiconductor substrate and each drain region is separated from an adjacent drain region by semiconductor substrate material having the first type conductivity.

21. A method for fabricating a memory device comprising the steps of:

providing a semiconductor substrate having a first type conductivity;

forming a plurality of parallel selection gates on said substrate with a gate dielectric layer interposed therebetween;

forming a plurality of common source regions in said substrate by a first ion implantation process, the common source regions being disposed between adjacent parallel selection gates; and forming a plurality of drain regions in said substrate by a second ion implantation process using a mask including parallel lines oriented perpendicular to the plurality of parallel selection gates, wherein said plurality of common source regions and said plurality of drain regions have a second type conductivity opposite to said first type, and each of said plurality of common source regions is shared by at least two of said plurality of drain regions and by at least two common plate channels formed in said substrate beneath one of said plurality of parallel selection gates.

22. The method according to claim 21, wherein said first type and second type conductivities are p type and n type, respectively.

* * * * *